(12) United States Patent
Lee et al.

(10) Patent No.: US 12,069,916 B2
(45) Date of Patent: Aug. 20, 2024

(54) TOUCH DISPLAY DEVICE WITH SHORT CIRCUIT PREVENTION ELECTRODE

(71) Applicant: LG Display Co., Ltd., Seoul (KR)

(72) Inventors: Yangsik Lee, Seoul (KR); HwiDeuk Lee, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/957,771

(22) Filed: Sep. 30, 2022

(65) Prior Publication Data

US 2023/0172015 A1   Jun. 1, 2023

(30) Foreign Application Priority Data

Nov. 29, 2021   (KR) ........................ 10-2021-0166415

(51) Int. Cl.
*G06F 3/044*   (2006.01)
*G06F 3/041*   (2006.01)
*H10K 59/131*   (2023.01)
*H10K 59/40*   (2023.01)

(52) U.S. Cl.
CPC ......... *H10K 59/131* (2023.02); *G06F 3/0412* (2013.01); *G06F 3/0418* (2013.01); *G06F 3/0446* (2019.05); *G06F 2203/04107* (2013.01); *H10K 59/40* (2023.02)

(58) Field of Classification Search
CPC .... H10K 59/131; H10K 59/40; G06F 3/0446; G06F 3/0412; G06F 3/0418; G06F 2203/04107
See application file for complete search history.

(56) References Cited

U.S. PATENT DOCUMENTS

2021/0357050 A1* 11/2021 Li ....................... G06F 3/04164

* cited by examiner

*Primary Examiner* — Lisa S Landis
(74) *Attorney, Agent, or Firm* — Birch, Stewart, Kolasch & Birch, LLP

(57) ABSTRACT

A touch display device can include a touch electrode implemented using a material and disposed on a transmissive area of a subpixel. The touch electrode can be disposed easily in a display panel which a transmittance is high. Furthermore, a short circuit prevention electrode can be disposed between a second electrode of a light-emitting element and the touch electrode to reduce a defect occurrence of the touch electrode in a process, and various types of touch sensing function can be provided or a performance of a touch sensing can be improved by using the short circuit prevention electrode as an electrode performing a certain function.

22 Claims, 14 Drawing Sheets

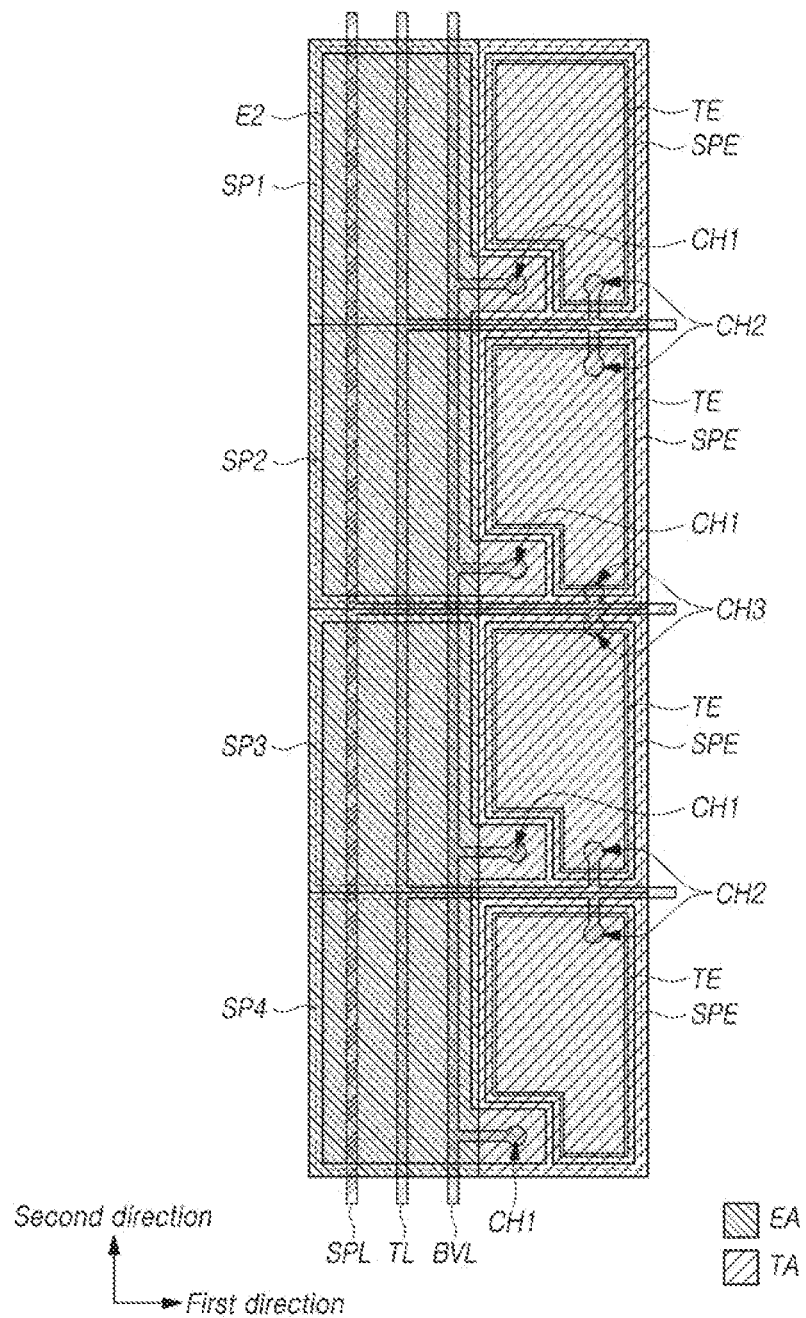

TOUCH DISPLAY DEVICE WITH SHORT CIRCUIT PREVENTION ELECTRODE

CROSS REFERENCE TO RELATED APPLICATION

This application claims priority to Korean Patent Application No. 10-2021-0166415, filed in the Republic of Korea on Nov. 29, 2021, the entire contents of which are hereby expressly incorporated by reference into the present application.

BACKGROUND

Field

Embodiments of the present disclosure are related to a touch display device.

Description of Related Art

Display devices can provide functions that recognize a touch by a user to a display panel and perform an input process based on the recognized touch. The display devices can include a touch electrode disposed on the display panel, or disposed inside of the display panel for a touch recognition.

In the case that the touch electrode is disposed on the display panel, the overall thickness of the display device can increase.

In the case that the touch electrode is disposed inside the display panel, the overall thickness of the display device can decrease, but it may not be easy to dispose the touch electrode inside the display panel due to various electrodes for a display driving, which are positioned inside the display panel.

SUMMARY OF THE DISCLOSURE

Embodiments of the present disclosure can provide a touch display device being capable of implementing a touch electrode inside a display panel easily, and providing various types of touch sensing function using the touch electrode and/or improving the performance of touch sensing.

Embodiments of the present disclosure can provide a touch display device including a substrate on which a plurality of subpixels including a light-emitting area and a transmissive area are disposed, a light-emitting element disposed on each of the plurality of subpixels and including a first electrode, a light-emitting layer and a second electrode, a touch electrode disposed on the transmissive area of at least one of the plurality of subpixels and disposed to be separated from the second electrode of the light-emitting element, and a short circuit prevention electrode positioned between the second electrode of the light-emitting element and the touch electrode and disposed to surround the touch electrode.

Embodiments of the present disclosure can provide a touch display device including a substrate on which a plurality of subpixels including a light-emitting area and a transmissive area are disposed, a light-emitting element disposed on each of the plurality of subpixels and including a first electrode, a light-emitting layer and a second electrode, and a touch electrode disposed on the transmissive area of at least one of the plurality of subpixels, disposed to be separated from the second electrode of the light-emitting element, and including a transparent material same as the second electrode of the light-emitting element.

Embodiments of the present disclosure can provide a touch display device including a substrate on which a plurality of subpixels including a light-emitting area and a transmissive area are disposed, a first touch electrode disposed on the transmissive area of at least one of the plurality of subpixels, and a second touch electrode disposed on the transmissive area of at least one of the plurality of subpixels, electrically separated from the first touch electrode, and disposed to surround the first touch electrode.

According to various embodiments of the present disclosure, as a touch electrode is implemented by using a material which is disposed on a transmissive area of a subpixel and same as a second electrode of a light-emitting element, the touch electrode can be disposed inside a display panel easily.

According to various embodiments of the present disclosure, as a short circuit prevention electrode is disposed between a touch electrode and a second electrode of a light-emitting element and the short circuit prevention electrode is driven as various methods, various types of touch sensing function can be provided, or a performance of the touch sensing can be improved.

BRIEF DESCRIPTION OF THE DRAWINGS

The above and other objects, features, and advantages of the present disclosure will be more clearly understood from the following detailed description, taken in conjunction with the accompanying drawings, in which:

FIGS. 9A, 9B and 9C are diagrams illustrating still other examples of a plane structure that a touch electrode is disposed in a touch display device according to embodiments of the present disclosure.

DETAILED DESCRIPTION OF THE EMBODIMENTS

Figure 1:
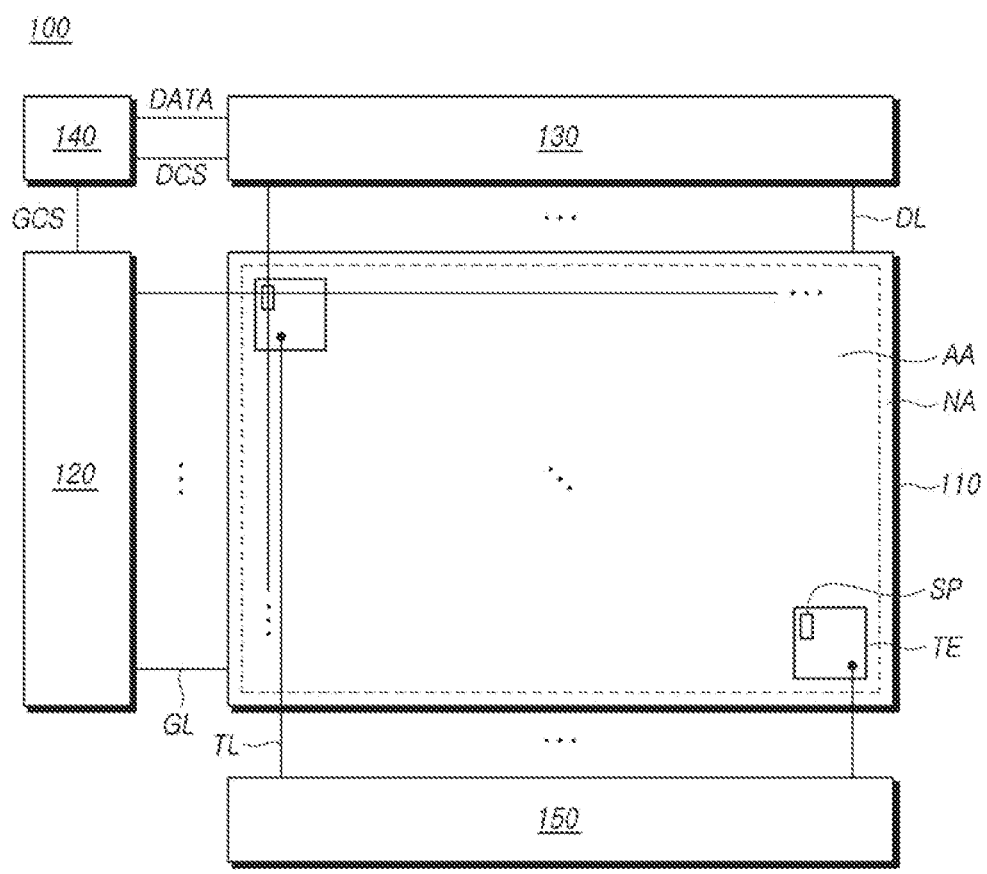
FIG. 1 is a diagram schematically illustrating a configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein may be omitted or may be provided briefly when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can". Also, "on" can be interpreted to mean "in". For instance, an element/layer disposed "on" a specific area can mean that the same element/layer is disposed in and/or on the specific area.

Hereinafter, various embodiments of the present disclosure will be described in detail with reference to accompanying drawings. All the components of each touch display device according to all embodiments of the present disclosure are operatively coupled and configured.

FIG. 1 is a diagram schematically illustrating a configuration of a touch display device 100 according to embodiments of the present disclosure.

Referring to FIG. 1, the touch display device 100 according to the embodiments of the present disclosure can comprise a display panel 110 comprising an active area AA where a plurality of subpixels SP is disposed and a non-active area NA which is located outside the active area AA. The touch display device 100 can comprise a gate driving circuit 120, a data driving circuit 130 and a controller 140 for driving various signal lines disposed in the display panel 110.

A plurality of gate lines GL and a plurality of data lines DL can be disposed in the display panel 110. The plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can comprise one or more gate driver integrated circuits GDIC. The gate driving circuit 120 can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method, or can be implemented by a gate-in-panel GIP method to then be directly arranged on the display panel 110. In some cases, each gate driver integrated circuit GDIC can be integrated and arranged on the display panel 110. In addition, each gate driver integrated circuit GDIC can be implemented by a chip-on-film COF method in which an element is mounted on a film connected to the display panel 110.

The data driving circuit 130 receives image data from the controller 140 and converts the image data into an analog data voltage Vdata. Then, the data driving circuit 130 outputs the data voltage Vdata to each data line DL according to the timing at which the scan signal is applied through the gate line GL so that each of the plurality of subpixels SP emits light having brightness according to the image data.

The data driving circuit 130 can comprise one or more source driver integrated circuits SDIC.

Each source driver integrated circuit SDIC can comprise a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method, or can be directly disposed on the display panel 110. Alternatively, in some cases, each source driver integrated circuit SDIC can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 120 and the data driving circuit 130, and controls the operation of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 allows the gate driving circuit 120 to output a scan signal according to the timing implemented in each frame, and converts a data signal received from the outside to conform to the data signal format used in the data driving circuit 130 and then outputs the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 outputs various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 outputs various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The touch display device 100 can further comprise a power management integrated circuit for supplying various voltages or currents to the display panel 110, the gate driving circuit 120, the data driving circuit 130, and the like or controlling various voltages or currents to be supplied thereto.

A liquid crystal or a light-emitting element can be disposed on each subpixel SP depending on the type of the display panel 110. In addition, an electrode which the data voltage Vdata is applied, and an electrode which a common voltage is applied or the like can be disposed on the subpixel SP.

Furthermore, the touch display device 100 can comprise a sensor, a line and a driving circuit or the like for sensing a touch of a user to the display panel 110.

For example, the touch display device 100 according to embodiments of the present disclosure can comprise a plurality of touch electrodes TE disposed on the active area AA, a touch driving circuit 150 for driving the touch electrode TE, and a plurality of touch lines TL connecting the touch electrode TE and the touch driving circuit 150 to each other. Furthermore, the touch display device 100 can comprise a touch controller for controlling the touch driving circuit 150 and sensing a touch based on a signal detected by the touch driving circuit 150.

The touch electrode TE, for example, can be a transparent electrode. Alternatively, the touch electrode TE can be an opaque electrode and at least a portion of the touch electrode TE can be opened.

In the case that the touch electrode TE comprises an opened portion, the touch electrode TE can be a mesh shape. The opened portion of the touch electrode TE can be overlapped to a light-emitting area disposed on each subpixel SP.

A connection structure of the touch line TL and the touch electrode TE can be various according to an arrangement structure of the touch electrode TE and a touch sensing method. For example, one touch line TL can be connected to a plurality of touch electrode TE, or at least one touch line TL can be connected to each touch electrode TE.

For example, the plurality of touch electrode TE can comprise a plurality of touch electrode TE connected in an X-axis direction, and a plurality of touch electrode TE connected in a Y-axis direction. And the touch line TL electrically connected to the touch electrode TE connected in the X-axis direction and the touch line TL electrically connected to the touch electrode TE connected in the Y-axis direction can be disposed.

In this case, the plurality of touch electrode TE can be disposed on a same layer. Some of the plurality of touch electrodes TE can be connected by a connecting line disposed on a same layer, and rest of the plurality of touch electrodes TE can be connected by a connecting line disposed on a different layer.

When a touch is sensed, a touch driving signal can be applied to the plurality of touch electrodes TE connected in the X-axis direction or the Y-axis direction, and a touch sensing signal can be detected from the plurality of touch electrodes TE connected in the X-axis direction or the Y-axis direction. In a state that different signals are applied to the touch electrode TE connected in the X-axis direction and the touch electrode TE connected in the Y-axis direction, a touch can be sensed by detecting a change of a mutual-capacitance between the touch electrodes TE occurred by the touch.

For another example, the plurality of touch electrodes TE can be disposed to be separated, and the touch line TL can be electrically connected to each touch electrode TE.

In this case, the plurality of touch electrode TE can be disposed on a same layer. The plurality of touch lines TL can be disposed on a layer different from a layer where the touch electrode TE is disposed. Each of the plurality of touch lines TL can be electrically connected to respective one of the plurality of touch electrodes TE. A portion of the touch line TL can be overlapped to the touch electrode TE which is not electrically connected to the touch line TL.

The touch driving signal can be supplied to the touch electrode TE through the touch line TL, and a touch can be sensed by detecting a change of a self-capacitance detected through the touch line TL.

Alternatively, in some cases, in a structure that the touch electrode TE connected in the X-axis direction and the touch electrode TE connected in the Y-axis direction are disposed, a sensing based on the mutual-capacitance and a sensing based on the self-capacitance can be performed.

The touch driving circuit 150 can output the touch driving signal to the touch electrode TE through the touch line TL, and can detect the touch sensing signal from the touch electrode TE.

The touch driving circuit 150, for example, can comprise an operational amplifier which is connected to the touch line TL to supply the driving signal and receive the touch sensing signal, and a feedback capacitor which accumulates charges according to a signal received by the operational amplifier. Furthermore, the touch driving circuit 150 can comprise an integrator processing an output signal of the operational amplifier, a sample and hold circuit and an analog-to-digital converter, or the like.

The touch driving circuit 150 can convert the touch sensing signal detected from the touch electrode TE into a digital type of sensing data, and can transmit the sensing data to the touch controller. The touch controller can detect presence or absence of a touch and a touch coordinate or the like based on the sensing data received from the touch driving circuit 150.

The touch driving circuit 150 can be disposed on the display panel 110 as a separate circuit, in some cases, can be implemented as an integrated type with the data driving circuit 130 or the like and be disposed.

According to embodiments of the present disclosure, a touch of a user to the display panel 110 can be sensed by driving the touch electrode TE included in the touch display device 100. And the touch electrode TE can be disposed on the display panel 100, or can be disposed as an embedded type in the display panel 110.

Here, in the case that the touch electrode TE is disposed as the embedded type in the display panel 110, depending on types of the touch display device 100, a structure that the touch electrode TE is disposed can be different.

For example, the touch electrode TE, in the case that the touch display device 100 is a top emission structure, can be disposed on an encapsulation portion protecting the light-emitting element in the display panel 110. Alternatively, the touch electrode TE, in the case that the touch display device 100 is a bottom emission structure, can be disposed under the light-emitting element. Alternatively, the touch electrode TE can be implemented by using at least some of layers constituting a light-emitting element in the display panel 110.

Figure 2:
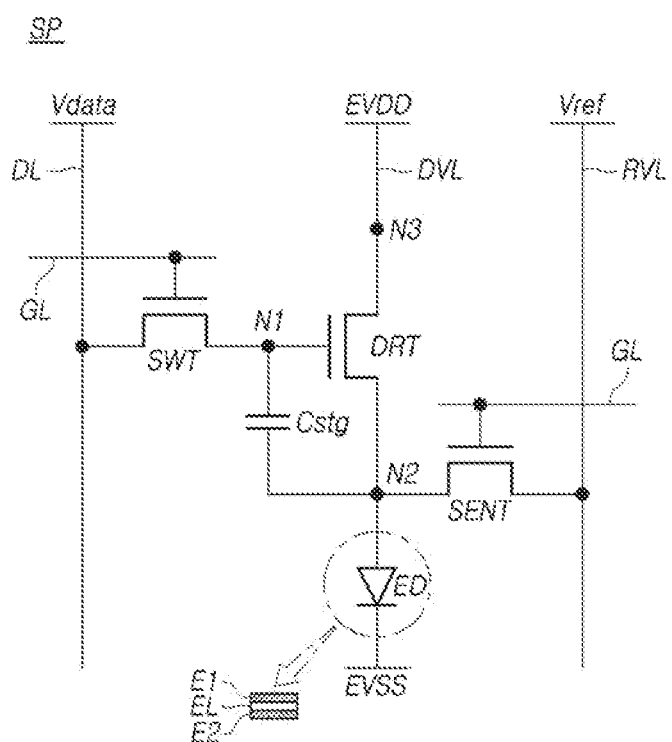
FIG. 2 is a diagram illustrating an example of a circuit structure of a subpixel included in a touch display device according to embodiments of the present disclosure.

FIG. 2 is a diagram illustrating an example of a circuit structure of the subpixel SP included in the touch display device 100 according to embodiments of the present disclosure.

More specifically, FIG. 2 illustrates an example of a circuit structure of the subpixel SP in the case that the touch display device 100 is an organic light-emitting display device, but embodiments of the present disclosure can apply to other type of display device.

Referring to FIG. 2, a light-emitting element ED and a driving transistor DRT for driving the light-emitting element ED can be disposed on the subpixel SP. Furthermore, at least one circuit element other than the light-emitting element ED and the driving transistor DRT can be disposed on the subpixel SP.

For example, such as an example illustrated in FIG. 2, a switching transistor SWT, a sensing transistor SENT and a storage capacitor Cstg can be further disposed on the subpixel SP.

Thus, the example illustrated in FIG. 2 illustrates exemplary 3T1C structure that three thin film transistor and one capacitor other than the light-emitting element ED are disposed on the subpixel SP, but embodiments of the present disclosure are not limited to this. Furthermore, the example illustrated in FIG. 2 illustrates exemplary a case that the thin film transistor is a N type all, but in some cases, the thin film transistor disposed on the subpixel SP can be a P type.

The switching transistor SWT can be electrically connected between the data line DL and a first node N1.

The data voltage Vdata can be supplied to the subpixel SP through the data line DL. The first node N1 can be a gate node of the driving transistor DRT.

The switching transistor SWT can be controlled by the scan signal supplied to the gate line GL. The switching transistor SWT can control that the data voltage Vdata supplied through the data line DL is applied to the gate node of the driving transistor DRT.

The driving transistor DRT can be electrically connected between a driving voltage line DVL and the light-emitting element ED.

A first driving voltage EVDD can be supplied to a third node N3 through the driving voltage line DVL. The first driving voltage EVDD, for example, can be a high potential driving voltage. The third node N3 can be a drain node or a source node of the driving transistor DRT.

The driving transistor DRT can be controlled by a voltage applied to the first node N1. And the driving transistor DRT can control a driving current supplied to the light-emitting element ED.

The sensing transistor SENT can be electrically connected between a reference voltage line RVL and a second node N2.

A reference voltage Vref can be supplied to the second node N2 through the reference voltage line RVL. The second node N2 can be the source node or the drain node of the driving transistor DRT.

The sensing transistor SENT can be controlled by the scan signal supplied to the gate line GL. The gate line GL controlling the sensing transistor SENT can be same as, or different from the gate line GL controlling the switching transistor SWT.

The sensing transistor SENT can control that the reference voltage Vref is applied to the second node N2. Furthermore, the sensing transistor SENT, in some cases, can control to sense a voltage of the second node N2 through the reference voltage line RVL.

The storage capacitor Cstg can be electrically connected between the first node N1 and the second node N2. The storage capacitor Cstg can maintain the data voltage Vdata applied to the first node N1 during one frame.

The light-emitting element ED can be electrically connected between the second node N2 and a line to which a second driving voltage EVSS is supplied. The second driving voltage EVSS, for example, can be a low potential driving voltage.

The light-emitting element ED can include a first electrode E1, a light-emitting layer EL and a second electrode E2. The first electrode E1 of the light-emitting element ED can be electrically connected to the driving transistor DRT. The second electrode E2 of the light-emitting element ED can be electrically connected to the line to which the second driving voltage EVSS is supplied. The light-emitting layer EL can emit a light according to the driving current supplied by the driving transistor DRT.

When the scan signal of a turn-on level is applied to the gate line GL, the switching transistor SWT and the sensing transistor SENT can be turned-on. The data voltage Vdata can be applied to the first node N1, and the reference voltage Vref can be applied to the second node N2.

The driving current supplied by the driving transistor DRT can be determined depending on a difference between a voltage of the first node N1 and a voltage of the second node N2.

The light-emitting element ED can represent a luminance according to the driving current supplied through the driving transistor DRT.

According to that types of the touch display device 100 are various, the subpixel SP can include a transmissive area having a high transmittance other than an area where the light-emitting element ED is disposed.

Figure 3A:
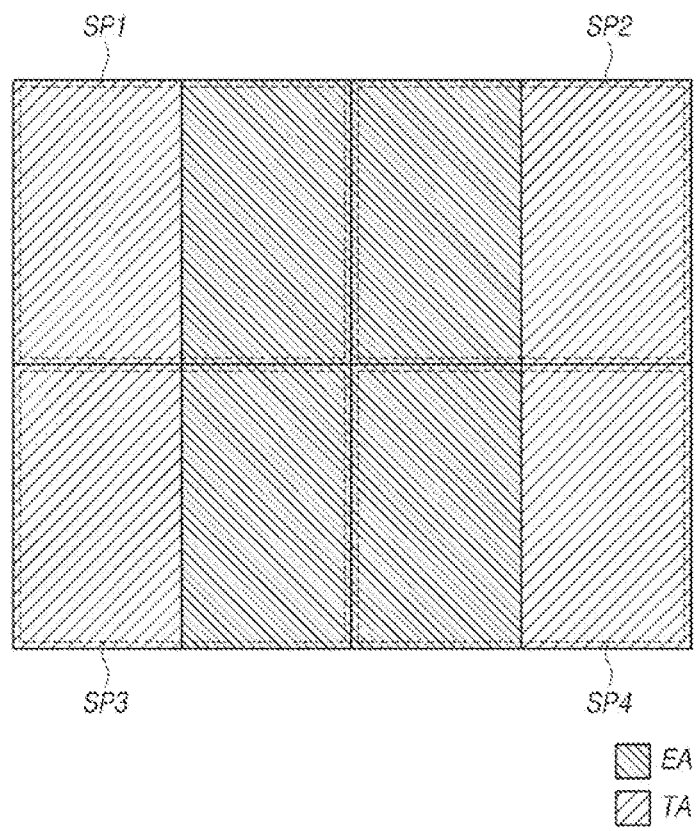
FIGS. 3A and 3B are diagrams illustrating different examples of a plane structure of a subpixel included in a touch display device according to embodiments of the present disclosure.
Figure 3B:
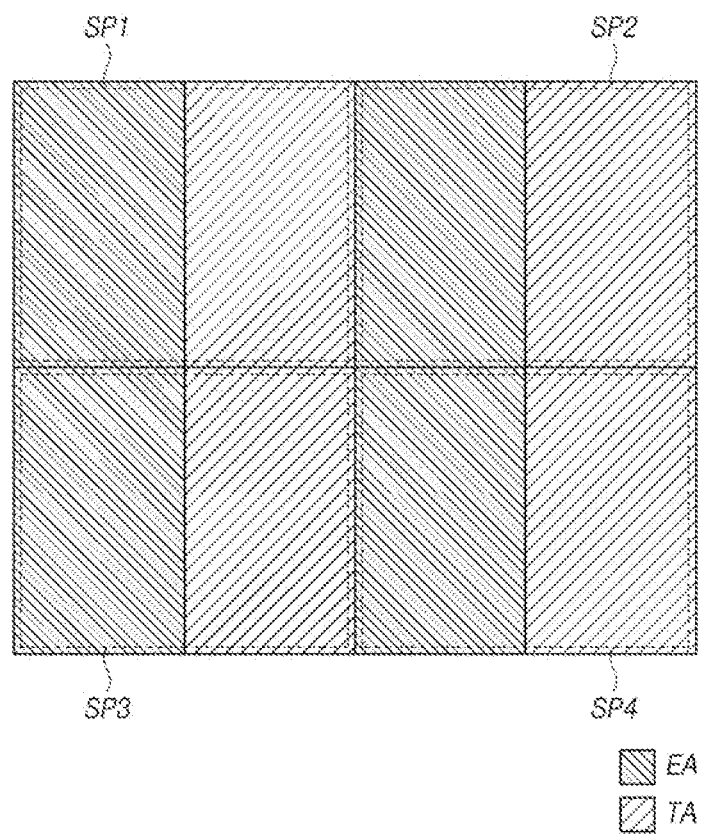

FIGS. 3A and 3B are diagrams illustrating different examples of a plane structure of the subpixel SP included in the touch display device 100 according to embodiments of the present disclosure.

Referring to FIG. 3A, two or more subpixels SP can constitute one pixel. At least some of the two or more subpixels SP constituting one pixel can emit different colors.

Further, FIG. 3A illustrates an example that four subpixels SP1, SP2, SP3, SP4 constitute one pixel, but embodiments of the present disclosure are not limited to this. Furthermore, FIG. 3A illustrates an example that four subpixels SP1, SP2, SP3, SP4 are disposed by dividing one pixel into quadrants vertically and horizontally, but in some cases, four subpixels SP1, SP2, SP3, SP4 can be disposed in a line to constitute one pixel, and also can constitute one pixel as various structures other than above these.

Each of four subpixels SP1, SP2, SP3, SP4 can include a light-emitting area EA and a transmissive area TA.

The light-emitting area EA can be an area where the light-emitting element ED is disposed. The light-emitting area EA can be an area where a circuit element or a signal line driving the light-emitting element ED is disposed. For example, in the case that the touch display device 100 is a top emission structure, the light-emitting element ED can be disposed on a layer where the circuit element or the signal line is disposed. According to that the light-emitting element ED disposed on the light-emitting area EA is driving, the subpixel SP can represent a luminance corresponding to the data voltage Vdata and an image can be displayed.

The transmissive area TA can be an area where the light-emitting element ED is not disposed. The transmissive area TA can be an area where the circuit element or the signal line driving the light-emitting element ED is not disposed. In some cases, a part of the circuit element or a part of the signal line can be disposed on the transmissive area TA.

Since the transmissive area TA is an area where the light-emitting element ED and the circuit element or the like are not disposed, thus the transmissive area TA can be an area having a high transmittance.

As each subpixel SP can include the transmissive area TA, in a period that the light-emitting element ED disposed on the light-emitting area EA is not driven, the touch display device 100 can be a display device having a high transmittance.

The light-emitting area EA included in each of four subpixels SP1, SP2, SP3, SP4 constituting one pixel can be disposed on a central portion of the pixel such as an example illustrated in FIG. 3A. The transmissive area TA can be positioned on a portion adjacent to outside of the pixel.

Alternatively, such as an example illustrated in FIG. 3B, the light-emitting area EA and the transmissive area TA included in each of four subpixels SP1, SP2, SP3, SP4 can be disposed as same structures. The light-emitting area EA and the transmissive area TA can be disposed to alternate with each other.

An arrangement structure of the light-emitting area EA and the transmissive area TA included in the subpixel SP is not limited to above-mentioned example, and a case that the transmissive area TA is positioned on a part of the subpixel SP can be included in embodiments of the present disclosure.

The light-emitting element ED, the circuit element and the signal line or the like are not disposed on the transmissive area TA, but in some cases, some of configurations disposed on the light-emitting area EA can be disposed on the transmissive area TA.

A structure that the touch sensing can be performed can be implemented by using configurations disposed on the transmissive area TA.

Figure 4:
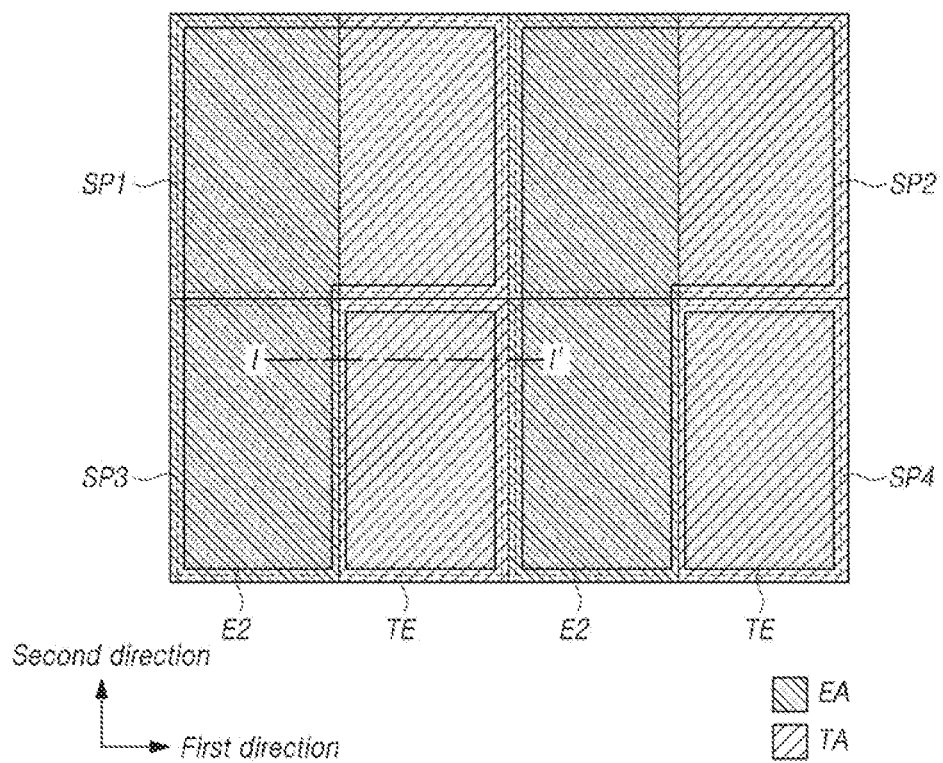
FIG. 4 is a diagram illustrating an example of a plane structure that a touch electrode is disposed in a touch display device according to embodiments of the present disclosure.
Figure 5:
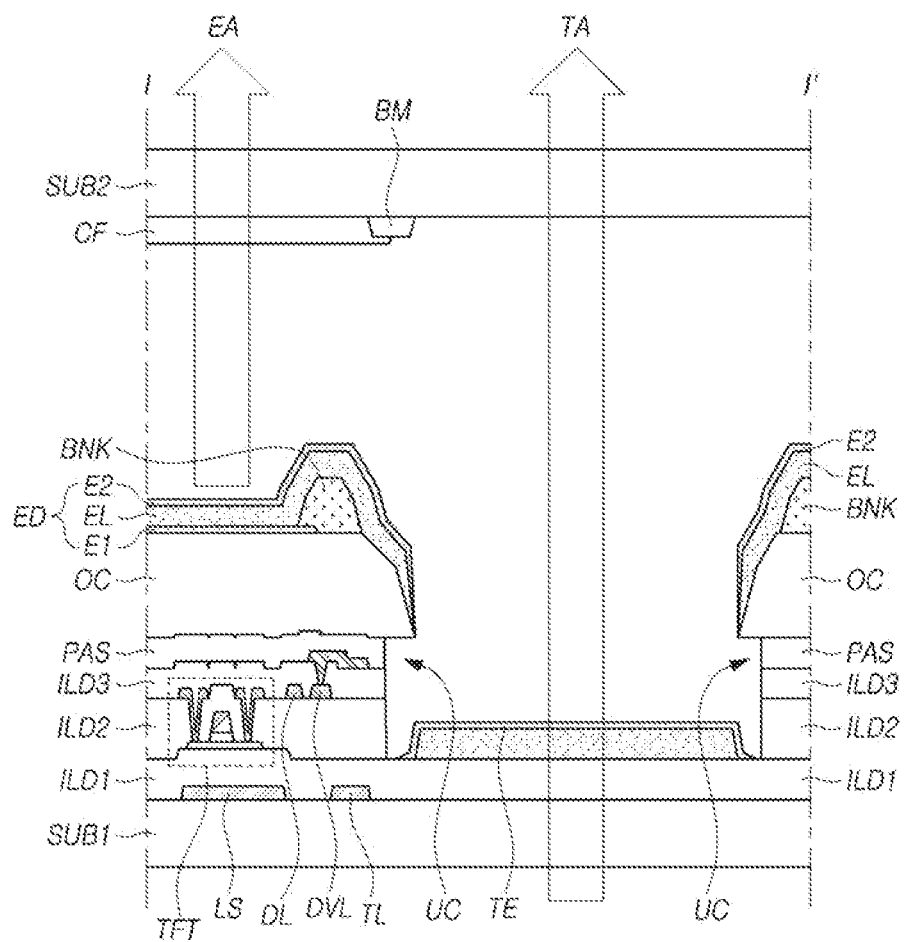
FIG. 5 is a cross-sectional view of I-I' portion illustrated in FIG. 4.

FIG. 4 is a diagram illustrating an example of a plane structure that the touch electrode TE is disposed in the touch display device 100 according to embodiments of the present disclosure. FIG. 5 is a cross-sectional view of I-I' portion illustrated in FIG. 4.

Referring to FIGS. 4 and 5, in the case that the touch display device 100 is a top emission structure, the second electrode E2 positioned on an upper layer of the light-emitting element ED can be made of a transparent material or a material having a high transmittance. For example, the second electrode E2 can be made of ITO (Indium Tin Oxide) or IZO (Indium Zinc Oxide) having a high transmittance, but not limited to this.

As the second electrode E2 is made of a transparent material, the second electrode E2 can be disposed on all of the light-emitting area EA and the transmissive area TA.

At least a portion of the second electrode E2 disposed on the transmissive area TA can be divided to constitute the touch electrode TE.

For example, such as an example illustrated in FIG. 4, the second electrode E2 disposed on the transmissive area TA of a first subpixel SP1 and the transmissive area of a second subpixel SP2 can be disposed as a shape connected to the second electrode E2 disposed on the light-emitting area EA.

The touch electrode TE can be disposed to be separated from the second electrode E2 on the transmissive area TA of a third subpixel SP3 and the transmissive area TA of a fourth subpixel SP4.

A material disposed on the transmissive area TA of the third subpixel SP3 and the transmissive area TA of the fourth subpixel SP4 and same as the second electrode E3 can be disposed to be separated from the second electrode E2 of the light-emitting element ED and can be implemented as the touch electrode TE.

FIG. 4 illustrates an example that ½ of a material disposed on the transmissive area TA is the same as that used in the second electrode E2 of the light-emitting element ED, and the rest ½ of the material is used as the touch electrode TE. In some cases, a ratio of an area where the second electrode E2 is disposed on the transmissive area TA and an area where the touch electrode TE is disposed can vary.

As the touch electrode TE is disposed on an area corresponding to ½ of the transmissive area TA, the touch electrode TE can be disposed to be alternated with the second electrode E2 along a first direction and can be disposed to be alternated with the second electrode E2 along a second direction crossing the first direction.

Such as described above, as implementing the touch electrode TE by using a material disposed on the transmissive area TA of materials constituting the light-emitting element ED, a structure for the touch sensing can be disposed in the display panel 110 easily.

The touch electrode TE disposed on the transmissive area TA can be implemented by cutting a material constituting the second electrode E2 on some area in a process that the second electrode E2 of the light-emitting element ED is disposed.

Referring to FIG. 5, an undercut area UC can be positioned on a boundary of the light-emitting area EA. The second electrode E2 and the touch electrode TE can be disposed to be divided on a boundary of the light-emitting area EA and the transmissive area TA by the undercut area UC. The undercut area UC can be formed in a process that the circuit element and the signal line are disposed on the light-emitting area EA.

A material constituting a light shield layer LS can be disposed on a first substrate SUB1. In some cases, at least one buffer layer can be disposed on the first substrate SUB1.

The light shield layer LS can be positioned under a thin film transistor TFT. The light shield layer LS can block an external light input to a channel of the thin film transistor TFT.

The touch line TL can be disposed by using a material constituting the light shield layer LS. In some cases, at least a portion of the touch line TL can be made of at least one of materials using for constituting the thin film transistor TFT or the signal line other than the light shield layer LS.

At least one interlayer insulating layer ILD1, ILD2, ILD3 and the thin film transistor TFT can be disposed on the light shield layer LS. Various signal lines such as the data line DL or the driving voltage line DVL can be disposed over the light shield layer LS.

A passivation layer PAS can be disposed on a third interlayer insulating layer ILD3.

A structure of a metal layer and an insulating layer disposed on the light-emitting area EA illustrated in FIG. 5 is an example, a laminated structure of the light-emitting area EA can be various.

An overcoat layer OC can be disposed on the passivation layer PAS. A top surface of the overcoat layer OC can be planarized.

A portion of the passivation layer PAS and the interlayer insulating layer ILD1, ILD2, ILD3 positioned under a boundary of the overcoat layer OC can be removed in a process that the overcoat layer OC is disposed and etched.

The undercut area UC can be formed by removing a portion of the insulating layer positioned under the boundary of the overcoat layer OC.

A process of the overcoat layer OC is finished, and a process that the light-emitting element ED is disposed on the overcoat layer OC can be performed.

The light-emitting element ED is disposed, and the light-emitting element ED can be sealed by an encapsulation portion. A second substrate SUB2 of which a color filter layer CF and a black matrix BM are disposed on a bottom surface can be positioned on the light-emitting element ED.

The first electrode E1 can be disposed first in a process that the light-emitting element ED is disposed. The first electrode E1 can be disposed on the light-emitting area EA. A bank BNK can be disposed to define an area where the first electrode E1 is exposed.

The light-emitting layer EL and the second electrode E2 can be disposed on the first electrode E1 and the bank BNK.

The light-emitting layer EL and the second electrode E2, for example, can be deposited to be disposed on an entire surface of the display panel 110.

The light-emitting layer EL and the second electrode E2 can be disposed as a cut shape on the undercut area UC positioned on a boundary of the overcoat layer OC in a process that the light-emitting layer EL and the second electrode E2 are disposed.

A portion of a material constituting the second electrode E2 disposed on the overcoat layer OC can form the second electrode E2 of the light-emitting element ED. A portion of a material constituting the second electrode E2 which is cut by the undercut area UC and disposed on the transmissive area TA can form the touch electrode TE.

An opaque metal layer may not be disposed on the transmissive area TA of the subpixel SP. Some of the insulating layer disposed on the light-emitting area EA may not be disposed on the transmissive area TA.

A portion of the material constituting the second electrode E2 is disposed on the transmissive area TA, but the material constituting the second electrode E2 has a high transmittance, it may not drop a transmittance of the transmissive area TA.

As a portion of the material constituting the second electrode E2 disposed on the transmissive area TA is disposed to be cut from the second electrode E2 of the light-emitting element ED, a transparent touch electrode TE can be implemented.

A structure that the touch electrode TE is disposed in a process that the light-emitting element ED is disposed can be implemented without dropping the transmittance of the transmissive area TA.

As the touch electrode TE is disposed on the transmissive area TA where the light-emitting element ED is not positioned, the touch electrode TE can be positioned to be lower than the second electrode E2 of the light-emitting element ED. A distance between the touch electrode and the first substrate SUB1 can be smaller than a distance between the second electrode E2 of the light-emitting element ED and the first substrate SUB1.

The touch electrode TE disposed on the transmissive area TA, for example, can be electrically connected to the touch line TL through a contact hole formed in a first interlayer insulating layer ILD1. In some cases, a material constituting the light shield layer LS can constitute a pattern connected to the touch electrode TE, and the touch line TL can be implemented by using a material constituting the thin film transistor TFT or other signal lines.

The touch electrode TE can be implemented by the undercut area UC by the overcoat layer OC positioned on a boundary of the light-emitting area EA. In some cases, the touch electrode TE can be implemented by the undercut area UC positioned on the transmissive area TA.

Figure 6:
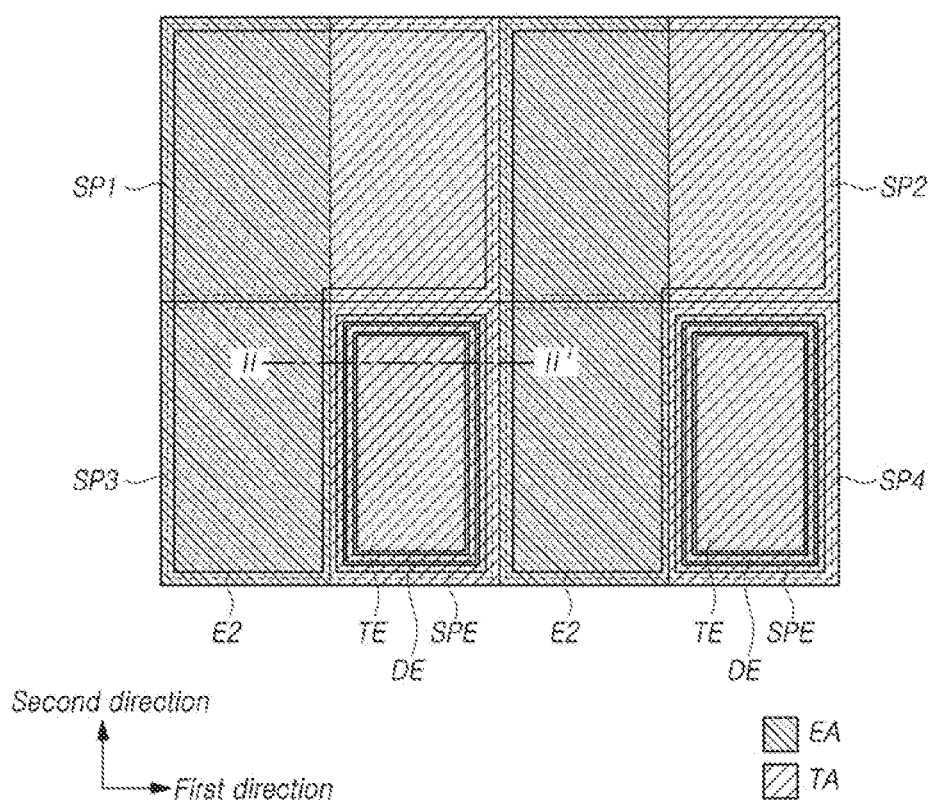
FIG. 6 is a diagram illustrating other example of a plane structure that a touch electrode is disposed in a touch display device according to embodiments of the present disclosure.
Figure 7:
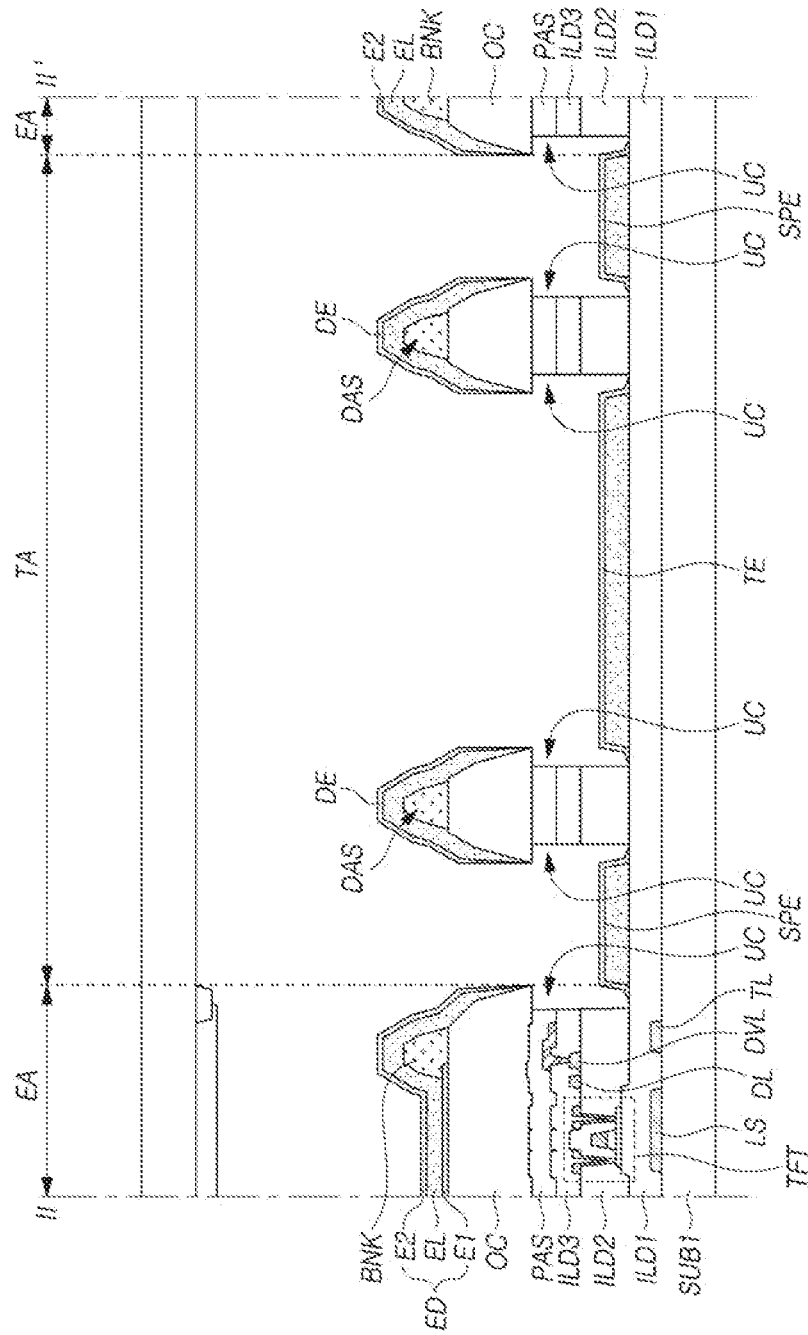
FIG. 7 is a cross-sectional view of II-II' portion illustrated in FIG. 6.

FIG. 6 is a diagram illustrating other example of a plane structure that the touch electrode TE is disposed in the touch display device 100 according to embodiments of the present disclosure. FIG. 7 is a cross-sectional view of II-II' portion illustrated in FIG. 6.

Referring to FIGS. 6 and 7, the touch electrode TE can be disposed by using at least some of a portion of a material constituting the second electrode E2 of the light-emitting element ED disposed on the transmissive area TA.

The touch electrode TE can be disposed on a part area of the transmissive area TA of the subpixel SP. The touch electrode TE, for example, can be disposed on the transmissive area TA of the third subpixel SP3 and the transmissive area TA of the fourth subpixel SP4.

At least one electrode pattern can be disposed between the touch electrode TE and the second electrode E2 of the light-emitting element ED.

The at least one electrode pattern can be made of a same material as the second electrode E2 of the light-emitting element ED. Thus, the at least one electrode pattern can be a same material as the touch electrode TE.

The at least one electrode pattern can be disposed to be separated from the second electrode E2 of the light-emitting element ED. The at least one electrode pattern can be disposed to be separated from the touch electrode TE. The at least one electrode pattern can be disposed to surround the touch electrode TE.

The at least one electrode pattern, for example, can be a short circuit prevention electrode SPE, a dummy electrode DE (such as second touch electrode).

Referring to FIG. 7, the circuit element and the light-emitting element ED can be disposed on the light-emitting area EA of the subpixel SP similarly to a structure described through FIG. 5.

At least one dam structure DAS can be disposed on the transmissive area TA of the subpixel SP.

The dam structure DAS can be positioned to be spaced from a boundary of the light-emitting area EA.

The dam structure DAS can be implemented by using at least some of materials disposed on the light-emitting area EA. For example, the dam structure DAS can be implemented by using same materials as a second interlayer insulating layer ILD2, the third interlayer insulating layer ILD3, the passivation layer PAS, the overcoat layer OC and the bank BNK.

The undercut area UC can be positioned on a boundary of the dam structure DAS. The undercut area UC positioned on the boundary of the dam structure DAS can be implemented by a same method as the undercut area UC positioned on a boundary of the light-emitting area EA.

A material constituting the second electrode E2 of the light-emitting element ED can be cut by the undercut area UC positioned on a boundary of the dam structure DAS in a process that the material constituting the second electrode E2 of the light-emitting element ED is disposed. A material disposed on both sides of the dam structure DAS can be disposed as a shape cut each other.

The material disposed inside of the dam structure DAS on the transmissive area TA can become the touch electrode TE.

A material disposed between the dam structure DAS and the light-emitting area EA can become the short circuit prevention electrode SPE. The short circuit prevention electrode SPE can be disposed to be separated from the second electrode E2 of the light-emitting element ED and the touch electrode TE. The short circuit prevention electrode SPE can be disposed to surround the touch electrode TE.

As the short circuit prevention electrode SPE is positioned between the second electrode E2 of the light-emitting element ED and the touch electrode TE by the undercut area UC of the dam structure DAS, even in the case that a defect in a process is occurred, it can be prevented that a short circuit between the second electrode E2 of the light-emitting element ED and the touch electrode TE is occurred on a boundary of the light-emitting area EA.

A material disposed on the dam structure DAS can become the dummy electrode DE. The dummy electrode DE can be disposed to be separated from the touch electrode TE and the short circuit prevention electrode SPE.

The dummy electrode DE can be disposed to surround the touch electrode TE. The short circuit prevention electrode SPE can be disposed to surround the dummy electrode DE.

The dummy electrode DE can also reduce that a short circuit between the second electrode E2 of the light-emitting element ED and the touch electrode TE is occurred.

Such as described above, the touch electrode TE can be disposed on the transmissive area TA while preventing or reducing the defect in a process by the dam structure DAS positioned on the transmissive area TA.

The dam structure DAS, for example, can be disposed to surround a periphery of the touch electrode TE. FIG. 7 illustrates an example that one dam structure DAS is disposed, in some cases, two or more dam structures DAS can be disposed.

A process that the touch electrode TE is disposed can be improved by the short circuit prevention electrode SPE and the dummy electrode DE disposed between the second electrode E2 of the light-emitting element ED and the touch electrode TE.

The short circuit prevention electrode SPE and the dummy electrode DE can be disposed in a state that an electrical signal is not applied.

In some cases, at least one of the short circuit prevention electrode SPE or the dummy electrode DE can be supplied the electrical signal and can be an electrode performing a certain function.

Figure 8:
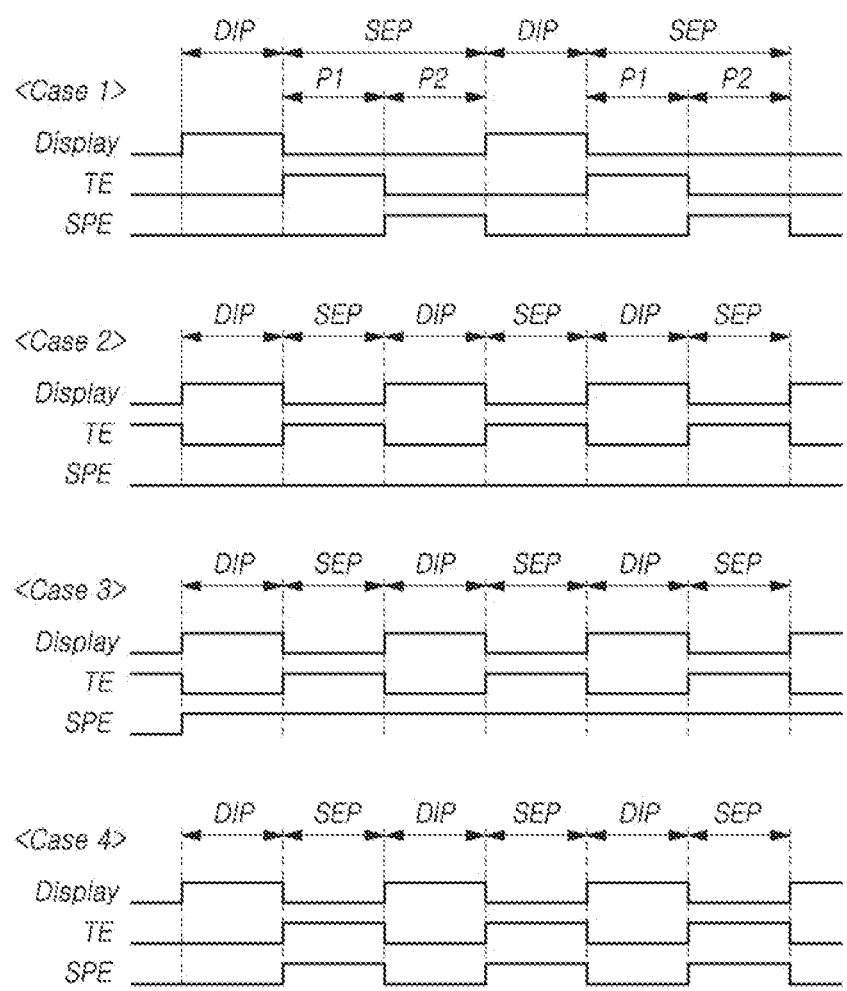
FIG. 8 is a diagram illustrating an example of a driving method of a touch electrode and a short circuit prevention electrode included in a touch display device according to embodiments of the present disclosure.

FIG. 8 is a diagram illustrating an example of a driving method of the touch electrode TE and the short circuit prevention electrode SPE included in the touch display device 100 according to embodiments of the present disclosure.

Referring to FIG. 8, it illustrates an example that the electrical signal is applied to the short circuit prevention electrode SPE, but in some cases, the electrical signal can be applied to the dummy electrode DE.

Furthermore, such as describe above, two or more dam structures DAS can be disposed on the transmissive area TA, in this case, two or more short circuit prevention electrodes SPE or two or more dummy electrodes DE can be formed. Thus, by applying the electrical signal to only some electrode of the short circuit prevention electrode SPE and the dummy electrode DE, a certain function by a driving of the short circuit prevention electrode SPE or the dummy electrode DE can be provided while maintaining a structure preventing the short circuit between the second electrode E2 of the light-emitting element ED and the touch electrode TE.

Referring to Case 1 illustrated in FIG. 8, the touch electrode TE and the short circuit prevention electrode SPE can be driven in a touch sensing period SEP which is different from a display driving period DIP.

The display driving period DIP, for example, can mean a period in which the data voltage Vdata is supplied to the subpixel SP through the data line DL. In some cases, a light-emitting state of the light-emitting element ED can be maintained in a period other than the display driving period DIP.

A first touch driving signal can be supplied to the touch electrode TE in a first period P1 of the touch sensing period SEP. A second touch driving signal can be supplied to the short circuit prevention electrode SPE in a second period P2 of the touch sensing period SEP.

The second touch driving signal can be identical to the first touch driving signal. Alternatively, the second touch driving signal can be different from the first touch driving signal. For example, an amplitude of the second touch driving signal can be greater than an amplitude of the first touch driving signal.

In this case, a type of the touch sensing performed by the short circuit prevention electrode SPE can be different from a type of the touch sensing performed by the touch electrode TE.

For example, a touch contacted to the display panel 110 can be detected by a driving of the touch electrode TE. It can be detected by a driving of the short circuit prevention electrode SPE that an object approaches to an area adjacent to the display panel 110. For example, a position of a finger or a pen can be detected in a state that the finger or the pen is positioned on an area apart from the display panel 110.

Such as described above, by differentiating a signal applied to short circuit prevention electrode SPE from a signal applied to the touch electrode TE, other type of touch sensing can be performed by the short circuit prevention electrode SPE.

Furthermore, the touch sensing by a self-capacitance sensing method can be performed by each of the touch electrode TE and the short circuit prevention electrode SPE, in some cases, the touch sensing by a mutual capacitance sensing method can be performed by using the touch electrode TE and the short circuit prevention electrode SPE together.

Referring to Case 2, the touch driving signal can be applied to the touch electrode TE in the touch sensing period SEP.

A signal different from the touch driving signal can be applied to the short circuit prevention electrode SPE in the touch sensing period SEP. For example, an alternating current signal is applied to the touch electrode TE and a direct current signal can be applied to the short circuit prevention electrode SPE.

When a change of the mutual capacitance between the touch electrode TE and the short circuit prevention electrode SPE by the touch, the touch sensing can be performed by detecting the touch sensing signal from the short circuit prevention electrode SPE.

Thus, in an electrode structure of the self-capacitance sensing method, the touch sensing by the mutual capacitance sensing method can be performed.

The short circuit prevention electrode SPE can perform a function of the touch sensing, but in some cases, can perform a function improving a performance of the touch sensing by the touch electrode TE.

Referring to Case 3, the touch driving signal can be supplied to the touch electrode TE in the touch sensing period SEP. A constant voltage can be applied to the short circuit prevention electrode SPE in the touch sensing period SEP. In some cases, the short circuit prevention electrode SPE can be maintained as a state that the constant voltage is applied in the display driving period DIP other than the touch sensing period SEP.

As the state that the constant voltage is applied to the short circuit prevention electrode SPE positioned between the second electrode E2 of the light-emitting element ED and the touch electrode TE, it can be prevented or reduced that a parasitic capacitance by the light-emitting element ED or a signal line driving the light-emitting element ED affects the touch electrode TE.

Furthermore, in some cases, a signal corresponding to the touch driving signal applied to the touch electrode TE can be supplied to the short circuit prevention electrode SPE.

Referring to Case 4, the touch driving signal can be supplied to the touch electrode TE in the touch sensing period SEP. A shield driving signal corresponding to the touch driving signal can be supplied to the short circuit prevention electrode SPE in the touch sensing period SEP. The shield driving signal can be a signal identical to at least one of a frequency, a phase or an amplitude of the touch driving signal.

As the shield driving signal corresponding to the touch driving signal is applied to the short circuit prevention electrode SPE positioned between the second electrode E2 of the light-emitting element ED and the touch electrode TE, a parasitic capacitance may not be formed between the touch electrode TE and the short circuit prevention electrode SPE.

A parasitic capacitance by the light-emitting element ED or a signal line driving the light-emitting element ED can be blocked by the short circuit prevention electrode SPE.

Thus, the touch electrode TE may not be affected by the parasitic capacitance by the light-emitting element ED or the like, and a noise of a signal detected from the touch electrode TE can be reduced.

In this case, the touch sensing can be performed simultaneously with the display driving period DIP.

Such as described above, according to embodiments of the present disclosure, the touch electrode TE can be implemented by using some of materials disposed on the transmissive area TA of the subpixel SP, the touch electrode TE can be disposed inside of the display panel 110 easily.

Further, by arranging the short circuit prevention electrode SPE for preventing a short circuit between the touch electrode TE and the second electrode E2 of the light-emitting element ED, a defect occurrence can be reduced in a process of the touch electrode TE.

Furthermore, in some cases, as different type of touch sensing or a function blocking a noise of the touch sensing can be performed by using the short circuit prevention electrode SPE, various methods of touch sensing function can be provided and a performance of the touch sensing can be improved.

Moreover, an area where the touch electrode TE is disposed on the transmissive area TA of the subpixel SP can be increased for improving a performance of the touch sensing.

Figure 9A:
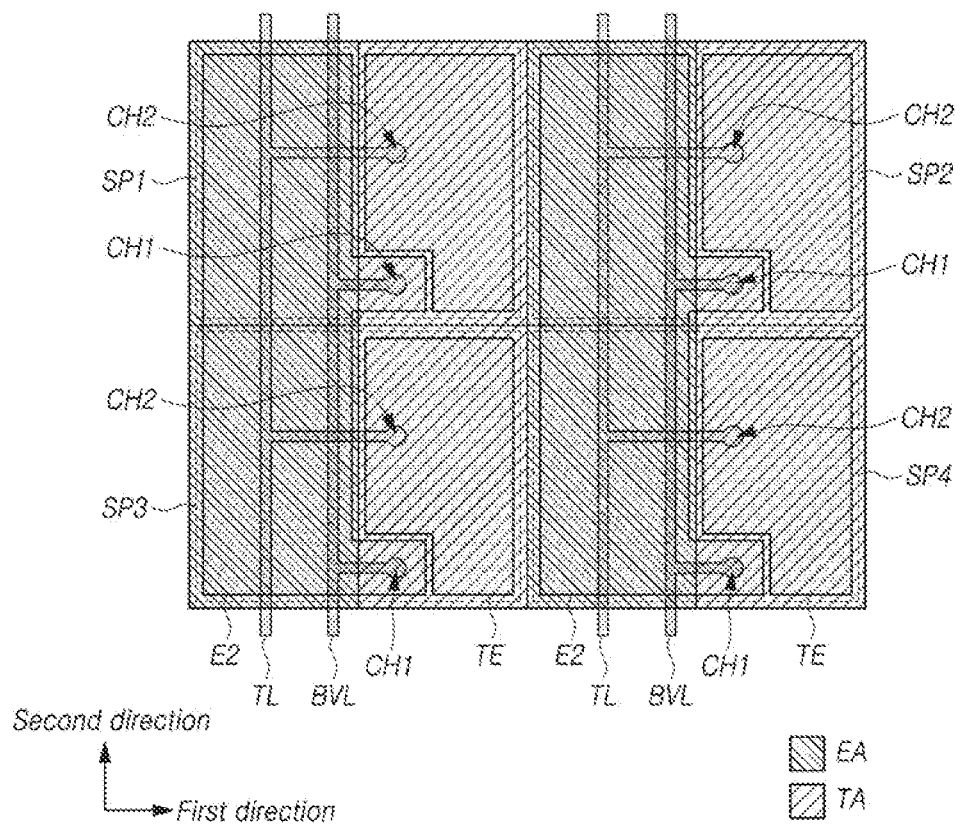
Figure 9B:
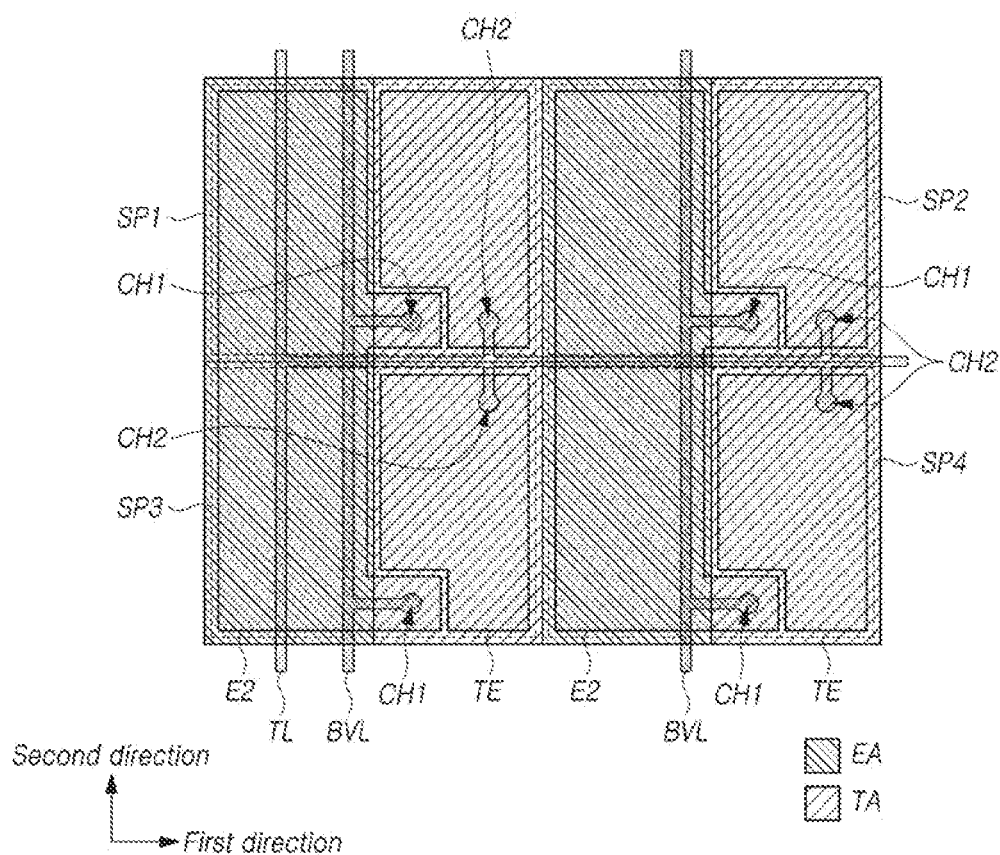

FIGS. 9A, 9B and 9C are diagrams illustrating still other examples of a plane structure that the touch electrode TE is disposed in the touch display device 100 according to embodiments of the present disclosure.

Referring to FIG. 9A, each of four subpixels SP1, SP2, SP3, SP4 constituting one pixel can include the transmissive area TA. A material disposed on the transmissive area TA of the four subpixels SP1, SP2, SP3, SP4 and same as the second electrode E2 of the light-emitting element ED can constitute the touch electrode TE.

As the touch electrode TE can be disposed on almost of the transmissive area TA included in the subpixel SP, an area of the touch electrode TE can be increased and a sensitivity of the touch sensing can be improved.

In the case that the touch electrode TE is disposed on almost of the transmissive area TA, a portion of the second electrode E2 of the light-emitting element ED can be disposed on a part area of the transmissive area TA.

For example, a portion that the second electrode E2 of the light-emitting element ED is electrically connected to a base voltage line BVL (such as voltage supplying line) supplying the second driving voltage EVSS can be positioned on the transmissive area TA.

The second electrode E2 of the light-emitting element ED can be electrically connected to the base voltage line BVL through a first contact hole CH1 positioned on the transmissive area TA.

The second electrode E2 of the light-emitting element ED can be disposed on an upper layer of the light-emitting area EA, but the signal line such as the base voltage line BVL can be positioned on a lower layer. In a case that an electrical connection of the second electrode E2 of the light-emitting element ED and the base voltage line BVL is formed on the light-emitting area EA where a load is great since a plurality of circuit elements and signal lines or the like are disposed, a possibility of a defect occurrence in a process can be increased.

By forming the electrical connection between the second electrode E2 of the light-emitting element ED and the base voltage line BVL on the transmissive area TA where various metal layers and insulating layers are not disposed, the possibility of the defect occurrence in the process can be reduced.

The touch electrode TE can be disposed on an area other than a periphery area of the first contact hole CH1 where the second electrode E2 of the light-emitting element ED and the base voltage line BVL are connected on the transmissive area TA. Thus, the touch electrode TE can be disposed as a shape "¬". In some cases, the touch electrode TE can be disposed as a shape "⊏". The touch electrode TE can be disposed on an area other than a periphery of the first contact hole CH1 on the transmissive area TA and can be have various shapes.

The touch electrode TE can be electrically connected to the touch line TL through a second contact hole CH2.

The touch line TL can be disposed in a second direction on the light-emitting area EA. The touch line TL can be disposed on the light-emitting area EA and can be protruded toward a first direction. The touch line TL can be electrically connected to the touch electrode TE on the transmissive area TA.

As almost of the touch line TL can be disposed on the light-emitting area EA, a degree that a transmittance of the transmissive area TA is dropped can be reduced and/or minimized.

The touch electrodes TE disposed on the transmissive area TA of the subpixels SP adjacent in the second direction can be directly connected to each other.

Alternatively, in some cases, adjacent touch electrodes TE can be electrically connected by the touch line TL.

Referring to FIG. 9B, the touch electrodes TE can be disposed on the transmissive area TA of each of four subpixels SP1, SP2, SP3, SP4. The touch electrodes TE disposed on the transmissive area TA of each of four subpixels SP1, SP2, SP3, SP4 can be disposed to be separated from each other physically. The touch electrodes TE can be disposed on an area other than an area where the second electrode E2 of the light-emitting element ED and the base voltage line BVL are connected on the transmissive area TA.

The touch line TL can be disposed in the second direction on the light-emitting area EA.

The touch line TL can be protruded in the first direction and can be disposed on the transmissive area TA. The touch line TL can be disposed on the transmissive area TA, and can be electrically connected to the touch electrode TE through the second contact hole CH2.

The touch electrode TE disposed on the transmissive area TA of the first subpixel SP1 and the touch electrode TE disposed on the transmissive area TA of the third subpixel SP3 can be electrically connected by a portion which the touch line TL is disposed in the first direction.

Furthermore, the touch electrode TE disposed on the transmissive area TA of the second subpixel SP2 and the touch electrode TE disposed on the transmissive area TA of the fourth subpixel SP4 can be electrically connected by a portion which the touch line TL is disposed in the first direction.

As the touch electrodes TE divided and disposed on both sides of the second electrode E2 of the light-emitting element ED are electrically connected by the touch line TL disposed in the first direction, the number of the touch line TL disposed in the second direction can be reduced.

A structure connecting the plurality of touch electrodes TE each other can be implemented while reducing the number of the touch line TL.

As the number of the touch line TL disposed in the second direction is reduced, a space where a line for a driving of the short circuit prevention electrode SPE can be disposed can be secured.

Referring to FIG. 9C, it illustrates an example that the touch electrode TE and the short circuit prevention electrode SPE are disposed on the transmissive area TA of the subpixel SP. FIG. 9C illustrates a structure that four subpixels SP1, SP2, SP3, SP4 are disposed in a line in the second direction for a convenience of description. Furthermore, for the convenience of description, it illustrates that the dummy electrode DE positioned between the touch electrode TE and the short circuit prevention electrode SPE is omitted.

The second electrode E2 of the light-emitting element ED and the base voltage line BVL can be electrically connected through the first contact hole CH1 on the transmissive area TA of the subpixel SP.

The touch line TL can be disposed in the second direction on the light-emitting area EA, and can be protruded in the first direction. A portion of the touch line TL disposed in the first direction can be electrically connected to the touch electrodes TE positioned on both sides of the touch line TL through the second contact hole CH2.

For example, the touch electrode TE disposed on the transmissive area TA of the first subpixel SP1 and the touch electrode TE disposed on the transmissive area TA of the second subpixel SP2 can be electrically connected to a portion of same touch line TL. The touch electrode TE disposed on the transmissive area TA of the third subpixel SP3 and the touch electrode TE disposed on the transmissive area TA of the fourth subpixel SP4 can be electrically connected to a portion of same touch line TL.

A short circuit prevention electrode driving line SPL can be disposed in the second direction on the light-emitting area EA. The short circuit prevention electrode driving line SPL can be protruded in the first direction similarly to the touch line TL.

A portion of the short circuit prevention electrode driving line SPL protruded in the first direction can be electrically connected to the short circuit prevention electrodes SPE positioned on both sides of the short circuit prevention electrode driving line SPL through a third contact hole CH3.

For example, the short circuit prevention electrode driving line SPL can be electrically connected to the short circuit prevention electrode SPE disposed on the transmissive area TA of the second subpixel SP2 and the short circuit prevention electrode SPE disposed on the transmissive area TA of the third subpixel SP3.

The short circuit prevention electrode driving line SPL can be disposed to be alternated with the touch line TL in the first direction.

An electrical connecting structure of the touch electrode TE and the short circuit prevention electrode SPE disposed on each subpixel SP can be implemented by each of the touch line TL and the short circuit prevention electrode driving line SPL which is disposed alternately.

Thus, a structure that two or more touch electrodes TE are electrically connected to each other and a structure that two or more short circuit prevention electrodes SPE are electrically connected to each other can be implemented easily while reducing and/or minimizing the number of lines disposed on the subpixel SP.

The touch electrodes TE electrically connected to each other or the short circuit prevention electrodes SPE electrically connected to each other can constitute one block.

By this block structure, a touch sensing function using two or more touch electrodes TE, other type of touch sensing function using two or more short circuit prevention electrodes SPE or a function for improving a touch sensing performance of the touch electrode TE can be performed.

A block constituted by the touch electrode TE and a block constituted by the short circuit prevention electrode SPE can be corresponded to each other. Alternatively, in some cases, two blocks can be constituted differently.

Figure 10A:
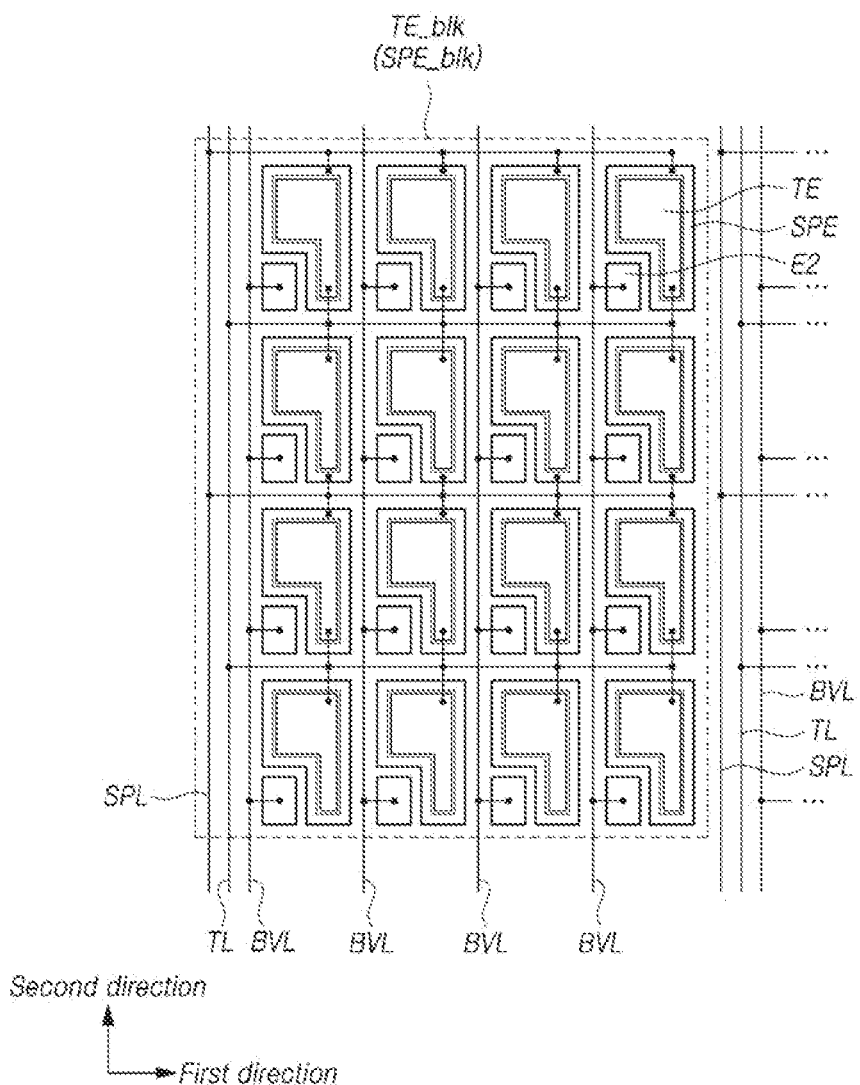
FIGS. 10A and 10B are diagrams illustrating an example of a structure of a touch electrode block and a short circuit prevention electrode block included in a touch display device according to embodiments of the present disclosure.
Figure 10B:
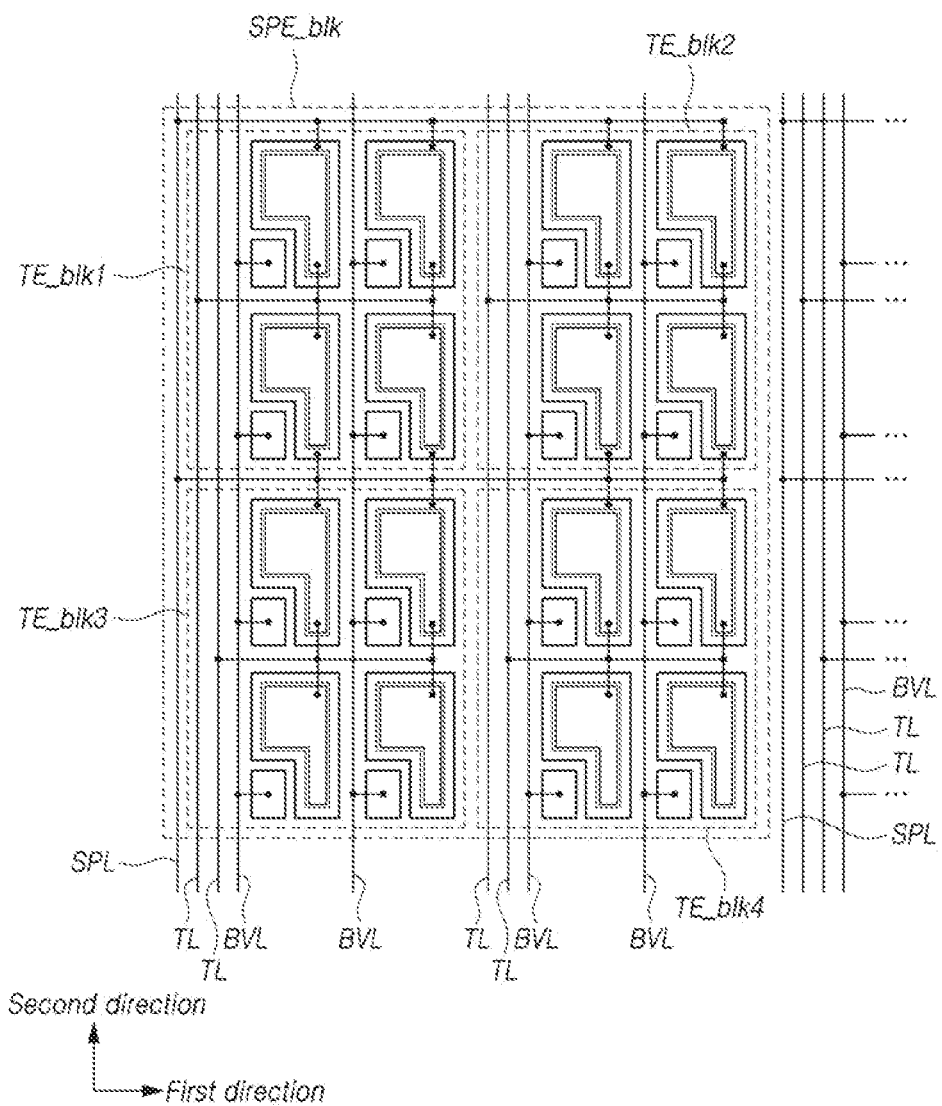

FIGS. 10A and 10B are diagrams illustrating an example of a structure of a touch electrode block TE_blk and a short circuit prevention electrode block SPE_blk included in the touch display device 100 according to embodiments of the present disclosure.

FIGS. 10A and 10B illustrate only electrode structure disposed on the transmissive area TA among the light-emitting area EA and the transmissive area TA of the subpixel SP, for the convenience of description.

Referring to FIG. 10A, a portion of the second electrode E2 of the light-emitting element ED, the touch electrode TE and the short circuit prevention electrode SPE can be disposed on the transmissive area TA of each subpixel SP.

The portion of the second electrode E2 of the light-emitting element ED can be disposed in the second direction and can be electrically connected to the base voltage line BVL protruded in the first direction. The base voltage line BVL, for example, can be disposed on each subpixel SP column.

The touch electrode TE can be electrically connected to the touch line TL. The touch line TL can be disposed in the second direction and can be protruded in the first direction.

FIG. 10A illustrates an example that the touch electrodes TE disposed on the transmissive area TA of sixteen subpixels SP constitute one touch electrode block TE_blk.

One touch line TL can be disposed in the second direction for an electrical connection between the touch electrodes TE disposed on sixteen subpixels SP. The touch line TL can be protruded in the first direction and can be electrically connected to the touch electrodes TE of both sides.

Furthermore, the short circuit prevention electrodes SPE disposed on the transmissive area TA of sixteen subpixels SP can constitute one short circuit prevention electrode block SPE_blk same as the touch electrode TE.

The short circuit prevention electrode driving line SPL can be disposed in the second direction and can be protruded in the first direction to be electrically connected to the short circuit prevention electrodes SPE on both sides.

A portion of the touch line TL protruded in the first direction and a portion of the short circuit prevention electrode driving line SPL protruded in the first direction can be disposed to alternate in the second direction.

By a connecting structure above-mentioned, the touch electrodes TE included in sixteen subpixels SP can constitute one touch electrode block TE_blk, and the short circuit prevention electrodes SPE included in sixteen subpixels SP can constitute one short circuit prevention electrode block SPE_blk.

The short circuit prevention electrode block SPE_blk can be disposed to be corresponded to the touch electrode block TE_blk, and can perform different type of touch sensing function, or a function for improving the touch sensing performance by the touch electrode TE.

Alternatively, the short circuit prevention electrode block SPE_blk can be constituted to be different from the touch electrode block TE_blk, and can perform a certain function.

Referring to FIG. 10B, for example, the touch electrodes TE disposed on the transmissive area TA of four subpixels SP can constitute one touch electrode block TE_blk. Four touch electrode blocks TE_blk1, TE_blk2, TE_blk3, TE_blk4 can be positioned on an area where sixteen subpixels SP are disposed.

The short circuit prevention electrodes SPE disposed on the transmissive area TA of sixteen subpixels SP can constitute one short circuit prevention electrode block SPE_blk.

One short circuit prevention electrode block SPE_blk can be corresponded to four touch electrode blocks TE_blk. One short circuit prevention electrode block SPE_blk can be corresponded to two or more touch electrode blocks TE_blk.

The number of the short circuit prevention electrodes SPE included in one short circuit prevention electrode block SPE_blk can be greater than the number of the touch electrodes TE included in one touch electrode block TE_blk.

As the short circuit prevention electrode block SPE_blk is disposed larger than the touch electrode block TE_blk and the number of the short circuit prevention electrode block SPE_blk is less than the number of the touch electrode block TE_blk, thus the number of the short circuit prevention electrode driving line SPL for a driving of the short circuit prevention electrode block SPE_blk can be reduced.

As the short circuit prevention electrode block SPE_blk is disposed larger than the touch electrode block TE_blk, the short circuit prevention electrode block SPE_blk can be used for the touch sensing required higher sensitivity than the touch sensing performed by the touch electrode block TE_blk.

For example, a sensing by the short circuit prevention electrode block SPE_blk can be performed for a hovering recognizing a position of a finger or a pen in a state that the finger or the pen is adjacent to the display panel 110. A sensing by the short circuit prevention electrode block SPE_blk can be performed in a state that an object is adjacent, and a sensing by the touch electrode block TE_blk can be performed in a state that the object is contacted.

Accordingly, various touch sensing functions using the short circuit prevention electrode block SPE_blk can be provided.

The embodiments of the present disclosure described above will be briefly described as follows.

A touch display device 100 according to embodiments of the present disclosure can include a substrate SUB on which a plurality of subpixels SP including a light-emitting area EA and a transmissive area TA are disposed, a light-emitting element ED disposed on each of the plurality of subpixels SP and including a first electrode E1, a light-emitting layer EL and a second electrode E2, a touch electrode TE disposed on the transmissive area TA of at least one of the plurality of subpixels SP and disposed to be separated from the second electrode E2 of the light-emitting element ED, and a short circuit prevention electrode SPE positioned between the second electrode E2 of the light-emitting element ED and the touch electrode TE and disposed to surround the touch electrode TE.

The touch electrode TE and the short circuit prevention electrode SPE can include a same material as the second electrode E2 of the light-emitting element ED.

The second electrode E2 of the light-emitting element ED, the touch electrode TE and the short circuit prevention electrode SPE can be transparent.

A distance between the touch electrode TE and the substrate SUB, and a distance between the short circuit prevention electrode SPE and the substrate SUB can be smaller than a distance between the second electrode E2 of the light-emitting element ED and the substrate SUB.

The short circuit prevention electrode SPE can be disposed on the transmissive area TA of at least one of the plurality of subpixels SP.

The touch display device 100 can further include at least one dam structure DAS positioned between the touch electrode TE and the short circuit prevention electrode SPE, and a dummy electrode DE disposed on the at least one dam structure DAS.

An undercut area can be positioned under a boundary of the at least one dam structure DAS, and the dummy electrode DE can be separated from the touch electrode TE and the short circuit prevention electrode SPE.

The at least one dam structure DAS can be positioned on the transmissive area TA of at least one of the plurality of subpixels SP.

The at least one dam structure DAS can be disposed to surround the touch electrode TE.

A first touch driving signal can be supplied to the touch electrode TE in a first period of a touch sensing period, and a second touch driving signal can be supplied to the short circuit prevention electrode SPE in a second period of the touch sensing period.

A touch driving signal can be supplied to any one of the touch electrode TE and the short circuit prevention electrode SPE, and a touch sensing signal can be detected from the other one of the touch electrode TE and the short circuit prevention electrode SPE.

A shield driving signal corresponding to a touch driving signal can be supplied to the short circuit prevention electrode SPE in at least a part period of a period in which the touch driving signal is supplied to the touch electrode TE.

A constant voltage can be supplied to the short circuit prevention electrode SPE in at least a part period of a period in which a touch driving signal is supplied to the touch electrode TE.

The touch electrode TE can be disposed to be alternated with the second electrode E2 of the light-emitting element ED along a first direction, and be disposed to be alternated with the second electrode E2 of the light-emitting element ED along a second direction crossing the first direction.

The touch electrodes TE disposed on each of at least two or more subpixels SP of the plurality of subpixels SP can be electrically connected to each other to constitute one touch electrode block TE_blk, and the short circuit prevention electrodes SPE disposed on each of at least two or more subpixels SP of the plurality of subpixels SP can be electrically connected to each other to constitute one short circuit prevention electrode block SPE_blk.

The number of the short circuit prevention electrodes SPE included in the one short circuit prevention electrode block SPE_blk can be greater than the number of the touch electrodes TE included in the one touch electrode block TE_blk.

The second electrode E2 of the light-emitting element ED can be electrically connected to a voltage supplying line on the transmissive area TA.

The touch display device 100 can further include a touch line TL electrically connected to the touch electrode TE, and a short circuit prevention electrode driving line SPL electrically connected to the short circuit prevention electrode SPE, and the touch electrode TE can be disposed to be alternated with the second electrode E2 of the light-emitting element ED along a first direction, and the touch line TL can be disposed to be alternated with the short circuit prevention electrode driving line SPL along a second direction crossing the first direction.

A touch display device 100 according to embodiments of the present disclosure can include a substrate SUB on which a plurality of subpixels SP including a light-emitting area EA and a transmissive area TA are disposed, a light-emitting element ED disposed on each of the plurality of subpixels SP and including a first electrode E1, a light-emitting layer EL and a second electrode E2, and a touch electrode TE disposed on the transmissive area TA of at least one of the plurality of subpixels SP, disposed to be separated from the second electrode E2 of the light-emitting element ED, and including a transparent material same as the second electrode E2 of the light-emitting element ED.

A touch display device 100 according to embodiments of the present disclosure can include a substrate SUB on which a plurality of subpixels SP including a light-emitting area EA and a transmissive area TA are disposed, a first touch electrode disposed on the transmissive area TA of at least one of the plurality of subpixels SP, and a second touch electrode disposed on the transmissive area TA of at least one of the plurality of subpixels SP, electrically separated from the first touch electrode, and disposed to surround the first touch electrode.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. That is for example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device, comprising:
   a plurality of subpixels disposed on a substrate, the plurality of subpixels including a light-emitting area and a transmissive area;
   a light-emitting element disposed in each of the plurality of subpixels, and including a first electrode, a light-emitting layer and a second electrode;
   a touch electrode disposed in the transmissive area of at least one of the plurality of subpixels, and disposed to be separated from the second electrode of the light-emitting element; and
   a short circuit prevention electrode positioned between the second electrode of the light-emitting element and the touch electrode, and disposed to surround the touch electrode.

2. The touch display device of claim 1, wherein the touch electrode and the short circuit prevention electrode include a same material as the second electrode of the light-emitting element.

3. The touch display device of claim 1, wherein the second electrode of the light-emitting element, the touch electrode and the short circuit prevention electrode are transparent.

4. The touch display device of claim 1, wherein a distance between the touch electrode and the substrate, and a distance between the short circuit prevention electrode and the substrate are smaller than a distance between the second electrode of the light-emitting element and the substrate.

5. The touch display device of claim 1, wherein the short circuit prevention electrode is disposed in the transmissive area of at least one of the plurality of subpixels.

6. The touch display device of claim 1, further comprising:
   at least one dam structure positioned between the touch electrode and the short circuit prevention electrode; and a dummy electrode disposed on the at least one dam structure.

7. The touch display device of claim 6, wherein an undercut area is positioned under a boundary of the at least one dam structure, and the dummy electrode is separated from the touch electrode and the short circuit prevention electrode.

8. The touch display device of claim 6, wherein the at least one dam structure is positioned in the transmissive area of at least one of the plurality of subpixels.

9. The touch display device of claim 6, wherein the at least one dam structure is disposed to surround the touch electrode.

10. The touch display device of claim 1, wherein a first touch driving signal is supplied to the touch electrode in a first period of a touch sensing period, and a second touch driving signal is supplied to the short circuit prevention electrode in a second period of the touch sensing period.

11. The touch display device of claim 1, wherein a touch driving signal is supplied to any one of the touch electrode and the short circuit prevention electrode, and a touch sensing signal is detected from the other one of the touch electrode and the short circuit prevention electrode.

12. The touch display device of claim 1, wherein a constant voltage is supplied to the short circuit prevention electrode in at least a part period of a period in which a touch driving signal is supplied to the touch electrode.

13. The touch display device of claim 1, wherein a shield driving signal corresponding to a touch driving signal is supplied to the short circuit prevention electrode in at least a part period of a period in which the touch driving signal is supplied to the touch electrode.

14. The touch display device of claim 1, wherein the touch electrode is disposed to be alternated with the second electrode of the light-emitting element along a first direction, and is disposed to be alternated with the second electrode of the light-emitting element along a second direction crossing the first direction.

15. The touch display device of claim 1, wherein the touch electrodes disposed on each of at least two or more subpixels of the plurality of subpixels are electrically connected to each other to constitute one touch electrode block, and
the short circuit prevention electrodes disposed on each of at least two or more subpixels of the plurality of subpixels are electrically connected to each other to constitute one short circuit prevention electrode block.

16. The touch display device of claim 15, wherein the number of the short circuit prevention electrodes included in the one short circuit prevention electrode block is greater than the number of the touch electrodes included in the one touch electrode block.

17. The touch display device of claim 1, wherein the second electrode of the light-emitting element is electrically connected to a voltage supplying line on the transmissive area.

18. The touch display device of claim 1, further comprising:
a touch line electrically connected to the touch electrode; and
a short circuit prevention electrode driving line electrically connected to the short circuit prevention electrode,
wherein the touch electrode is disposed to be alternated with the second electrode of the light-emitting element along a first direction, and the touch line is disposed to be alternated with the short circuit prevention electrode driving line along a second direction crossing the first direction.

19. A touch display device, comprising:
a plurality of subpixels disposed on a substrate, and including a light-emitting area and a transmissive area;
a light-emitting element disposed in each of the plurality of subpixels, and including a first electrode, a light-emitting layer and a second electrode;
a touch electrode disposed in the transmissive area of at least one of the plurality of subpixels, disposed to be separated from the second electrode of the light-emitting element, and including a transparent material same as the second electrode of the light-emitting element; and
a dummy electrode positioned between the second electrode of the light-emitting element and the touch electrode, and disposed in a different layer from the touch electrode.

20. A touch display device, comprising:
a plurality of subpixels disposed on a substrate, and including a light-emitting area and a transmissive area;
a first touch electrode disposed in the transmissive area of at least one of the plurality of subpixels; and
a second touch electrode disposed in the transmissive area of at least one of the plurality of subpixels, electrically separated from the first touch electrode, and disposed to surround the first touch electrode,
wherein the second touch electrode surrounds an entire edge of the first touch electrode.

21. The touch display device of claim 19, wherein the touch electrode extending in parallel to an upper surface of the substrate is disposed in a different layer from each of the first electrode and the second electrode, which extend in parallel to the upper surface of the substrate.

22. The touch display device of claim 20, further comprising:
a light-emitting element disposed in each of the plurality of subpixels and including a first electrode, a light-emitting layer and a second electrode,
wherein the touch electrode extending in parallel to an upper surface of the substrate is disposed in a different layer from each of the first electrode and the second electrode, which extend in parallel to the upper surface of the substrate.

* * * * *